(12) United States Patent
Bach et al.

(10) Patent No.: US 7,868,406 B2
(45) Date of Patent: Jan. 11, 2011

(54) PHOTODIODE BEING MONOLITHICALLY INTEGRATED ONTO A WAVEGUIDE

(75) Inventors: Heinz-Gunter Bach, Berlin (DE); Andreas Beling, Charlottesville, VA (US)

(73) Assignee: Fraunhofer Gesellschaft zur Forderung der Angewandten Forschung E.V., Munich (DE)

( * ) Notice: Subject to any disclaimer, the term of this patent is extended or adjusted under 35 U.S.C. 154(b) by 221 days.

(21) Appl. No.: 12/052,891

(22) Filed: Mar. 21, 2008

(65) Prior Publication Data

US 2009/0057796 A1   Mar. 5, 2009

Related U.S. Application Data

(63) Continuation-in-part of application No. PCT/DE2006/001655, filed on Sep. 18, 2006.

(30) Foreign Application Priority Data

Sep. 22, 2005   (DE) .................. 10 2005 045 286

(51) Int. Cl.
    *H01L 31/0232*   (2006.01)
(52) U.S. Cl. ............... 257/436; 257/461; 257/E31.127; 438/48
(58) Field of Classification Search .......... 257/E31.127, 257/436
    See application file for complete search history.

(56) References Cited

U.S. PATENT DOCUMENTS

| | | | | |
|---|---|---|---|---|
| 5,127,081 A | * | 6/1992 | Koren et al. | ................. 385/130 |
| 5,193,131 A | | 3/1993 | Bruno | ......................... 385/14 |
| 5,617,234 A | * | 4/1997 | Koga et al. | .................... 398/14 |
| 6,587,609 B2 | * | 7/2003 | Lee et al. | ....................... 385/16 |
| 2005/0135731 A1 | * | 6/2005 | Welch et al. | .................. 385/14 |

FOREIGN PATENT DOCUMENTS

| | | |
|---|---|---|
| EP | 0 511 913 B1 | 3/1997 |
| WO | WO 02/21178 A1 | 3/2002 |

OTHER PUBLICATIONS

Deri, R.J., Hamaguchi, H., Hawkins, R.J., Kuramata, A., Makiuchi, M., Wada, O., Yasuoka, N., Integrated waveguide/photodiodes using vertical impedance matching, Apr. 30, 1990, 1737-1739, vol. 56, No. 18, American Institute of Physics.

(Continued)

*Primary Examiner*—Ajay K Arora
(74) *Attorney, Agent, or Firm*—Brinks Hofer Gilson & Lione

(57) ABSTRACT

A waveguide-integrated photodiode for high bandwidths with a semi-insulating monomode supply waveguide monolithically integrated on a substrate, together with an overlying photodiode mesa structure having an electroconducting n-contact layer, an absorption layer, a p+-contact layer and a metallic p-contact, the refraction index of the n-contact layer being greater than the refraction index of the semi-insulating waveguide layer. Lengthening the n-contact layer by a predetermined length L in the direction of the supply waveguide in relation to the overlying layers correspondingly increases at least one factor of the product of quantum efficiency and bandwidth.

24 Claims, 2 Drawing Sheets

OTHER PUBLICATIONS

Bach, Heinz-Gunter, Baling, Andreas, Kunkel, Reinhard, Mekonnen, Gebre Giorgis, Schmidt, Detlef, High-Speed Miniaturized Photodiode and Parallel-Fed Traveling-Wave Photodetectors Based on InP, Jan./Feb. 2007, vol. 13, No. 1, IEEE Journal of Selected Topics in Quantum Electronics.

Anslem, Alex, Campbell, C., Demiguel, Kim, Jooyong, Stephane, Li, Ning, Li, Xiaowei, Lu, Hanfei, Zheng, Xiaoguang, Very High-Responsivity Evanescently Coupled Photodiodes Integrating a Short Planar Multimode Waveguide for High-Speed Applications, Dec. 2003, vol. 15, No. 12, IEEE Photonics Technology Letters.

Bachem, K.H., Jürgensen, H., Kaufmann, U., Maier, M., Merz, C., Santic, B., Schlotter, P., Electrical and Optical Properties of Oxygen Doped GaN Grown by MOCVD Using $N_2O$, 1997, vol. 26, No. 10, Journal of Electronic Materials.

Deri, Robert J., Hawkins, Raymond J., Wright, Ewan M., Coupled-mode theory of vertically integrated impedance-matched waveguide/photodetectors, May 15, 1995, pp. 170-178, Elsevier Science B.V., Optics Communications.

Andreadakis, N., Bhat, K. Deri, R.J., Doldissen, W., Hawkins, R.J., Koza, M.A., Schiavone, L.M., Seto, M., Silberberg, Y., Soole, B.D., Efficient vertical coupling of photodiodes to InGaAsP rib waveguides, Jun. 17, 1991, pp. 2749-2751, vol. 58, No. 24, American Institute of Physics.

* cited by examiner

PHOTODIODE BEING MONOLITHICALLY INTEGRATED ONTO A WAVEGUIDE

CROSS REFERENCE TO RELATED APPLICATIONS

This application is a continuation-in-part of, and claims all available benefit of, International application PCT/DE2006/001655, filed Sep. 18, 2006, the disclosure of which is incorporated herein by reference.

BACKGROUND OF THE INVENTION

Due to the growing demand for speed and capacity of telecommunication systems, high-bit rate optical fiber networks are needed in order to provide sufficient capacity for data transmission. As electronic circuitry is used for processing data which have been transferred by optical fiber networks previously, photodiodes are needed in order to convert an optical signal to an electric signal at the end of an optical fiber.

Usually, photodiodes used in optical communication networks are of the p-i-n-type. When converting an optical signal to an electronic signal, the optical power provided is absorbed by an absorption layer of the photodiode made from intrinsic semiconductor material, thereby generating pairs of electrons and holes. By providing an electric field inside the intrinsic absorption layer by means of the adjacent p- and n-contact layers, the charge carriers drift to the respective p- and n-contact layers, thereby generating an electric signal proportional to the optical signal provided. The time needed to generate the electric signal is given by the drift velocity and the drift length of the charge carriers and the time needed to reestablish the electric field given by the capacity of the photodiode and the resistance of the photodiode and its dedicated electrical signal lines. Therefore, a thin absorption layer would be preferred in order to minimize the drift length and a thick absorption layer is favorable by minimizing the capacity. Furthermore, a thin absorption layer can provide only a small volume and therefore a low quantum efficiency for charge carrier generation.

It is therefore an object of the present invention to provide a high-speed photodiode and a photodetector based on these photodiodes which can be used at frequency above 40 GHz.

SUMMARY OF THE INVENTION

The invention relates to a photodiode being monolithically integrated onto a waveguide and comprising a substrate having a first side and an opposing second side, a waveguide comprising a layer from a semi-insulating material having a first side and an opposing second side, the first side being arranged on the first side of the substrate, wherein the layer constituting the waveguide has a first refractive index. Furthermore, the photodiode comprises an electro-conductive n-contact layer having a first side and an opposing second side, wherein the first side of the electro-conductive n-contact layer is located on the second side of the layer constituting the waveguide and wherein the n-contact layer has a second refractive index and wherein the second refractive index of the n-contact layer is larger than the first refractive index of the semi-insulating waveguide layer. The photodiode comprises further an absorption layer having a first side and an opposing second side, wherein the first side of the absorption layer is arranged on the second side of the electro-conductive n-contact layer and at least one p-contact layer having a first side and an opposing second side, wherein the first side of the p-contact layer is arranged on the second side of the absorption layer. According to the invention, the n-contact layer is elongated in the direction of the waveguide by a length L compared to the absorption layer and the p-contact layer.

Furthermore, the invention relates to a photodetector comprising a plurality of photodiodes being monolithically integrated on a substrate having a first side and an opposing second side, any of the photodiodes comprising a waveguide comprising a layer from a semi-insulating material having a first side and an opposing second side, the first side being arranged on the first side of the substrate, wherein the layer constituting the waveguide has a first refractive index. Furthermore, the photodiode comprises an electro-conductive n-contact layer having a first side and an opposing second side, wherein the first side of the electro-conductive n-contact layer is located on the second side of the layer constituting the waveguide and wherein the n-contact layer has a second refractive index and wherein the second refractive index of the n-contact layer is larger than the first refractive index of the semi-insulating waveguide layer. The photodiode comprises further an absorption layer having a first side and an opposing second side, wherein the first side of the absorption layer is arranged on the second side of the electro-conductive n-contact layer and at least one p-contact layer having a first side and an opposing second side, wherein the first side of the p-contact layer is arranged on the second side of the absorption layer. According to the invention, the n-contact layer is elongated in the direction of the waveguide by a length L compared to the absorption layer and the p-contact layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF PREFERRED EMBODIMENTS OF THE INVENTION

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the detailed description are hereby expressly incorporated into this detailed description, with each claim standing on its own as a separate embodiment of this invention.

Figure 1:
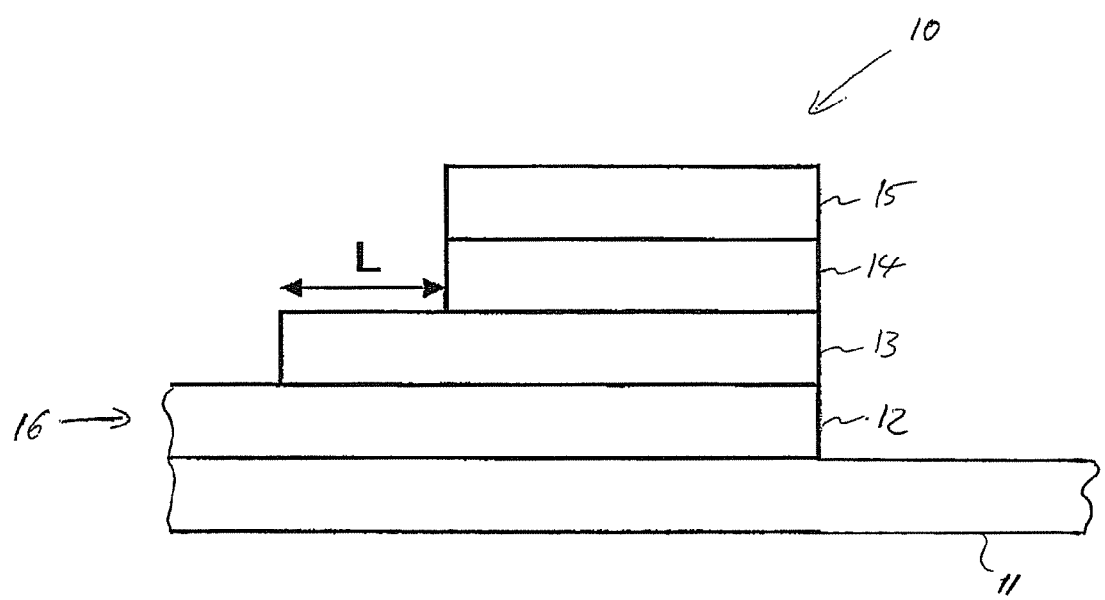
FIG. 1 illustrates an exemplary embodiment of a waveguide-integrated photodiode by means of a cross-sectional view through the different layers which may form at least a part of said photodiode.

FIG. 1 illustrates a cross-sectional view through a photodiode according to one exemplary embodiment of the invention. The photodiode 10 shown in FIG. 1 comprises a plurality of layers 12, 13, 14, 15 which may be formed from different materials by means of different processes and which may be arranged on a substrate 11.

The substrate 11 may be made from semi-insulating material such as InP or the like. A semi-insulating material as defined here may comprise a sheet resistance from $10^6$-$10^8$ $\Omega\cdot$cm. In order to achieve this sheet resistance, the semi-insulating material may comprise a dopant forming deep traps in order to compensate unwanted but unavoidable impurities incorporated into the semi-insulating material. Iron may be used as a dopant in order to increase the sheet resistance of the semi-insulating substrate to the desired value. The substrate may have a thickness ranging from 50 µm up to 500 µm. The substrate material may be formed from a single crystalline material.

On the substrate, a waveguide 12 is arranged. The layer forming the waveguide may be arranged directly on the substrate surface. In another embodiment, at least one inter-layer may be provided which is arranged between the substrate surface and the waveguide. These layers may be used to improve the adhesion between the substrate surface 11 and waveguide layer 12, compensate a lattice mismatch or improve the coupling of the optical power arriving at the waveguide layer 12 from direction 16 be means of an optical fiber.

The waveguide may have a thickness ranging from 0.5 µm up to 3 µm. The waveguide may comprise a layer made from InGaAsP. This layer may be obtained by an epitaxial growth process e.g. a MOVPE-process. The waveguide 12 also comprises a semi-insulating material with a sheet resistance between $10^6$-$10^8$ $\Omega\cdot$cm. In order to compensate unwanted but unavoidable impurities which may be added by the growth process, a dopant such as iron may be added to the InGaAsP-material of the waveguide-layer 12. The concentration of the dopant material added may be in the range from $10^{16}$-$10^{17}$ atoms per cm³ (at./cm³). The waveguide 12 has a first refractive index which is a constant of the material the wave guide 11 is made from. In one embodiment, the refractive index of the waveguide layer 12 may be 3.26 measured at a wavelength of 1550 nm. Those skilled in the art will realize that the refractive index may change with the wavelength and that the refractive index may be different at a different wavelength used.

Having deposited layer 12 on the substrate 11, a lateral pattern may be transferred to layer 12 by at least one masking and etching step. The lateral pattern limits the width of the waveguide to be smaller than the total width of layer 12. In one embodiment of the invention, the width of waveguide 12 may be between 0.5 up to 3 µm along most of its length. When reaching the diode stack comprising the layers 13, 14 and 15, the width of waveguide 12 may be increased to the width of the photodiode stack comprising layers 13, 14 and 15. In still another embodiment, the width of the waveguide may be greater than the width of subsequent layers. Applying a lateral pattern to layer 12 may be used to form a plurality of waveguides and a plurality of photo diode stacks. Hereinafter the width is defined to be measured in a direction substantially perpendicular to the direction of optical wave traveling inside the waveguide. A dimension parallel to this direction is referenced as a length.

On the waveguide layer 12 a photodiode is formed. The photodiode comprises three layers 13, 14 and 15. The composition and function of these layers is subsequently disclosed. Adjacent to the waveguide 12 is an n-type contact layer 13. The contact layer 13 may have a thickness of 0.1 to 0.5 µm. In one embodiment, the thickness may be 0.3 µm. The n-contact layer also may be obtained from an epitaxial growth process such as a MOVPE-process. It may comprise InGaAsP and a dopant in order to achieve an n-conductive contact layer. Silicon may be used as a dopant with a concentration ranging from $10^{17}$ up to $10^{19}$ at./cm³. The dopant may be added to the n-contact layer 13 directly during the growth process, e.g. by means of a metal organic vapor phase deposition process.

The n-contact layer has a second refractive index. In order to achieve a good coupling of an optical wave from the waveguide 12 to the n-contact layer 13, the second refractive index of the n-contact layer is chosen as such that it is larger than first refractive index of the semi-insulating waveguide-layer 12. In one embodiment, the refractive index of the n-contact layer may be 3.41 measured at a wavelength of 1550 nm. Those skilled in the art will realize that the refractive index may change with the wavelength and that the refractive index may be different at a different wavelength used.

By means of the refractive index differences realized between the waveguide layer 12 and the n-contact layer 13, the light guided in the waveguide 12 may be prematurely coupled upwards and may reach the absorption area of the photodiode on considerably shorter lengths. Thus, a more uniform illumination of the absorption layer 14 may be provided and "dark" initial areas, which have a merely electric capacitive but no absorptive effect, may largely be avoided.

The width of the n-contact layer 13 equals at least the width of the waveguide layer 12 and the width of the absorption layer 14. In one embodiment, the width of the n-contact layer 13 may be greater than the width of the absorption layer 14 in order to allow contacts to be arranged beneath the absorption layer 14 on the top surface of the n-contact layer 13. Therefore, the width may be chosen from 4 µm up to 20 µm.

The n-contact layer 13 is elongated by a lengths L with respect to the length of the absorption layer 14 arranged on top of the n-contact layer 13. This additional length L of contact layer 13 may be used to improve the coupling of the electromagnetic wave from the waveguide 12 to the absorption layer 14. This aim may be achieved by choosing the length L to be between 1 µm and 11 µm. In one embodiment, the length L corresponds substantially to the beat length of the two light guiding vertical lowest order modes in a multimode waveguide area minus the absorption length.

In one embodiment of the invention, the n-contact layer elongated by the length L may fulfill the object of adjusting the refraction indices between waveguide 12 and absorption layer 14. In another embodiment of the invention, the n-contact layer elongated by the length L may fulfill the object of a low-resistive contacting of the absorption layer 14. In still another embodiment of the invention, the n-contact layer elongated by the length L may fulfill the object of controlling the optical intensity distribution in the active range of the photodiode for the purpose of illuminating the absorber as homogeneously as possible.

The n-contact layer 13 is coupled to an absorption layer 14. The absorption layer also may be obtained from an epitaxial growth process, e.g. a MOVPE-process. The absorption layer 14 may be obtained from a material comprising intrinsic InGaAs. The material may comprise some unavoidable impurities in the range of some $10^{15}$ up to some $10^{16}$ at./cm$^3$. Nevertheless, such a concentration of impurities is still defined in the context of this description to provide an intrinsic InGaAs-material. The absorption layer 14 may have an epitaxial thickness from 100 nm up to 600 nm.

The absorption layer 14 has a third refractive index. In order to allow a good coupling of the electromagnetic wave from the n-contact layer 13 to the absorption layer 14, in one embodiment the third refractive index is larger than the second refractive index of the n-contact layer 13. In one embodiment, the real part of the third refractive index may be 3.56 measured at a wavelength of 1550 nm. Those skilled in the art will realize that the refractive index may change with the wavelength and that the refractive index may be different at a different wavelength used.

The absorption layer 14 may have a width between 4 and 5 μm. In one embodiment of the invention, absorption layer 14 may have a length between 7 and 20 μm.

As the absorption layer 14 made from an undoped semiconductor material is arranged adjacent to the n-doped layer 13 and the p-doped layer 15, dopants may diffuse during manufacturing inside the absorption layer 14. Therefore, the effective thickness of the intrinsic semiconductor material may be smaller than the epitaxial thickness of the absorption layer 14.

On top of the absorption layer 14, a p-contact layer 15 is provided. The p-contact layer 15 has a fourth refractive index. In order to minimize optical power to couple into the p-contact layer 15, in one embodiment the fourth refractive index is smaller than the third refractive index of the absorption layer 15 measured at the wavelength of the incident light.

The p-contact layer may comprise any of an InGaAs- or an InGaAsP-material. It may consist of a plurality of layers made from different materials forming a heterostructure. The total thickness of the p-contact layer 15 may be between 300 nm up to 600 nm.

The p-contact layer 15 may comprise a dopant such as zinc. The dopant may be applied during epitaxial growth of the p-contact layer. In another embodiment of the invention, the dopant may be applied to the p-contact layer 15 by ion implanting or by diffusing a layer comprising the doping material into the p-contact layer 15. In order to allow a good conductivity, the doping level of the p-contact layer 15 is $10^{18}$ up to $10^{19}$ at./cm$^3$.

The length of the p-contact layer 15 corresponds roughly to the length of the absorption layer 14, i.e. 7 μm up to 20 μm. In one embodiment, the width of the contact layer 15 equals roughly the width of the absorption layer 14, i.e. 4 μm up to 5 μm.

In one embodiment, the waveguide 12, the n-contact layer 13, the absorption layer 14 and the p-contact layer 15 can be obtained by a single epitaxial growth process such as an MOVPE-process. The final cross section seen from FIG. 1 involving different length and width of the waveguide 12, the n-contact layer 13, the absorption layer 14 and the p-contact layer 15 can be obtained after the growth process of the layer structure by several masking steps, each of which is followed by a dry or a wet etching process.

As an example, a first etching process may produce the final width and length of the p-contact layer 15 and the absorption layer 14. The etch process is stopped when reaching the n-contact layer 13. Then, the second mask is applied in order to form the final width and length of the n-contact layer 13. This etching process forming the n-contact layer 13 is stopped when reaching the waveguide layer 12. In a further masking step, followed by a wet or dry etch process, the final dimension of the waveguide 12 is formed. The manufacturing process described may result in some adjacent layers to have different dimensions, as the etching process may be selective on the crystal face and/or the chemical composition of the different layers. Therefore, the photodiode formed from n-contact layer 13, absorption layer 14 and p-contact layer 15 may have either the form of a cuboid or the form of a mesa with decreasing width along its height.

Additional layers not shown in FIG. 1 may be present in order to couple the contact layers 13 and 15 to external electronic devices such as capacitors, resistors, microprocessors, amplifiers or the like. These interconnects may be made from any conductive material such a metal, an alloy or a polycrystalline silicon. The interconnects as well as the electronic devices may be integrated monolithically on the substrate 11 together with at least one photo diode 10.

Figure 2:
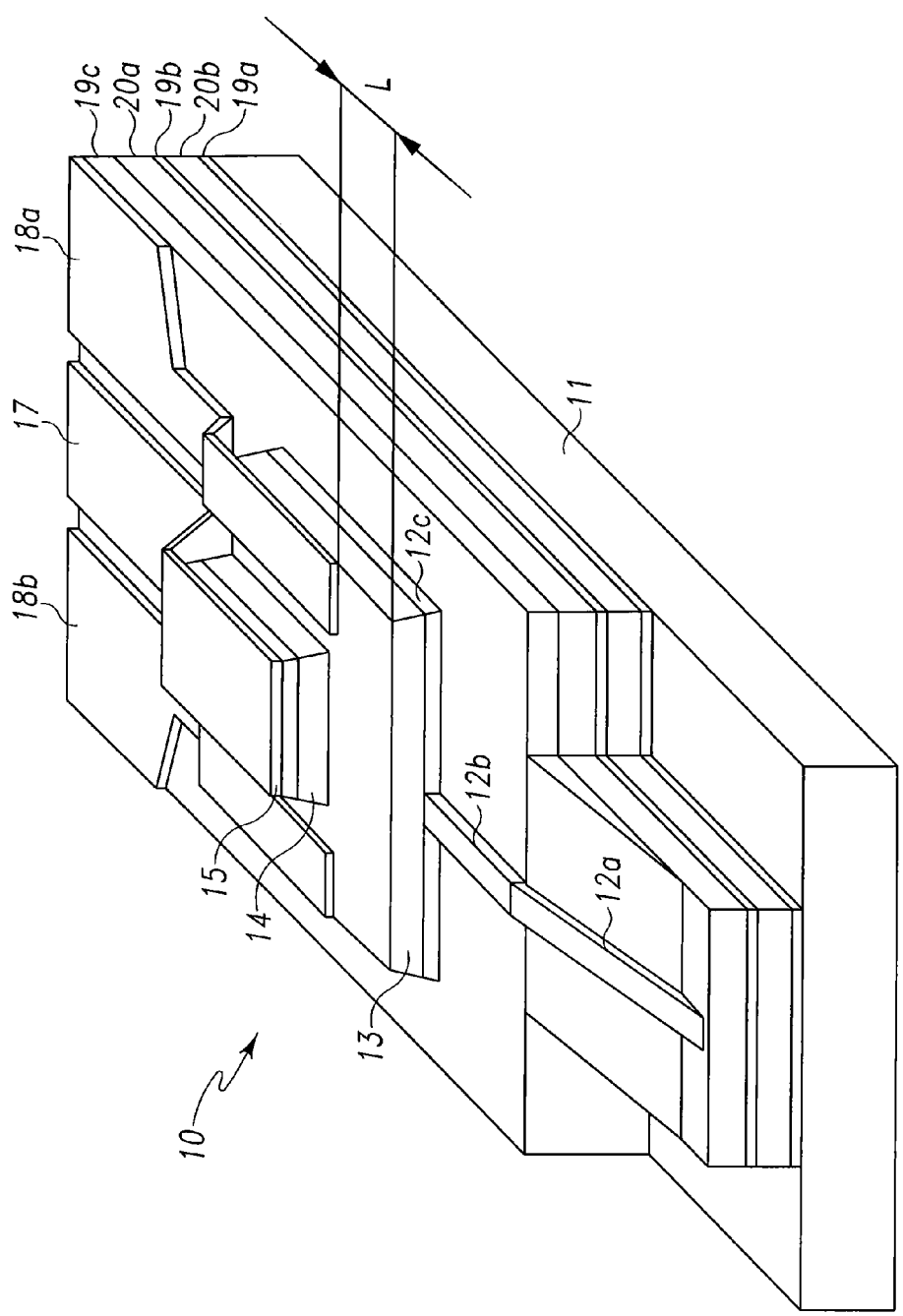
FIG. 2 illustrates another exemplary embodiment of a waveguide-integrated photodiode in a 3-dimensional view.

FIG. 2 shows a 3-dimensional view of another embodiment of a photodiode. The photodiode 10 shown in FIG. 2 is arranged on a semi-insulating substrate 11 having a sheet resistance between $10^6$-$10^8$ Ω·cm. The substrate may comprise InP. It may comprise a dopant providing deep traps in order to adjust the sheet resistance to a predefined value as described with respect to FIG. 1.

FIG. 2 illustrates a structured waveguide layer 12 having a second portion 12b having a width of 2 μm and thickness of 1 μm. Furthermore, the waveguide has a third portion 12c adjacent to an n-contact layer 13 of a photodiode 10 having a second width of 14 μm and a thickness of 1 μm. The waveguide has a first portion 12a which is intended to couple to a light emitting end of an optical fiber by means of two guiding layers 20a, 20b and three spacer layers 19a, 19b and 19c. The first portion of the waveguide 12a also has a width of 2 μm and a thickness of 1 μm at one end which couples to the second portion 12b and a tapered end coupling to the second guiding layer 20b.

Between the substrate 11 and the waveguide layer 12, a plurality of guiding layers 20a and 20b and spacer layers 19a, 19b and 19c is arranged. At least the last spacing layer 19c is made from a semi-insulating material having a sheet resistance between $10^6$ and $10^8$ Ω·cm in order to allow the monolithical integration of conductive interconnects 17 and 18 as well as further functional elements not shown in FIG. 2. It has to be noted that spacer layers 19a, 19b and 19c as well as the guiding layers 20a and 20b are completely optional and may be omitted in other embodiments of the invention.

Furthermore, FIG. 2 illustrates that the n-contact layer 13 as well as the second portion of the waveguide layer 12b have a greater length and a greater width than the absorption layer 14 and the contact layer 15 arranged on the n-contact layer 13. The additional length L of the contact layer 13 amounts between 1 μm and 11 μm. This additional length L may improve the coupling of the electromagnetic wave supplied by waveguide 12 to the absorption layer 14. The additional width of the contact layer 13 may accommodate conductive layers 18a and 18b which can be used to apply a supply voltage to the n-contact layer 13 in order to provide an electric field inside the absorption layer 14. Furthermore, the metallization layers 18a and 18b may be used to couple an electrical signal generated inside the photodiode 10 to subsequent functional elements such as capacitors, resistors, amplifiers or the like which may be monolithically integrated onto substrate 11.

In another embodiment of the invention, any of the shown metallization layers 18a or 18b may be omitted. In such an embodiment, the width of the n-contact layer 13 as well as the width of the second portion 12b of the waveguide layer may be reduced.

On top of the n-contact layer 13, the absorption layer 14 and the p-contact layer 15 are arranged as described with respect to FIG. 1. In one embodiment, the length of absorption layer 14 and contact layer 15 is 7 µm. The width of said layers is 4 µm.

On top of the contact layer 15, a conductive layer 17 may be provided, which may be used to couple the contact layer 15 to subsequent functional units, such as capacitors, resistors, amplifiers or the like. Such functional units may be integrated monolithically on substrate 11. Furthermore, the conductive layer 17 may be used in conjunction with the conductive layers 18a and 18b and the contact layer 13 to apply an electric field inside the absorption layer 14.

The conductive layers 17, 18a and 18b may be made from any conductive material such as a metal, an alloy, a polycrystalline silicon or the like. They may consist of a plurality of single layers which are arranged to form conductive layers 17, 18a and 18b. In order to improve the DC-isolation to other layers such as the spacer layer 19c, a dielectric material having a thickness of 50 nm up to 200 nm may be provided between any of the conductive layers 17, 18a and 18b and the spacer layer 19c. The dielectric layer may comprise any of a silicon oxide, a silicon nitride, a benzocyclobuten or the like.

The photodiode 10 described may comprise further layers not shown in detail such as a passivation layer or an anti-reflexion coating. Such layers may be made from benzocyclobuten, titaniumdioxide or the like. They may be obtained by a spin coating process, a physical vapor deposition, a chemical vapor deposition, a sputter process or the like.

In the foregoing, the invention has been described on a single photo-diode as an example. Those skilled in the art will realize, that the invention may also be used for all derived combined photodetector configurations consisting of single photodiodes, such as differential twin photodetectors, balanced photodetectors or travelling wave photodetectors comprising serial or parallel optical supply of the single photo diodes, which use the features of the inventive photodiode.

Although several embodiments of the invention have been illustrated in the accompanying drawings and described in the foregoing detailed description, it will be understood that the invention is not limited to the embodiments disclosed, but is capable of numerous rearrangements, modifications and substitutions without departing from the scope of the invention. Embodiments of the invention have been described in the form of functional elements such as a waveguide layer 12, a n-contact layer 13, an absorption layer 14 and a p-contact layer 15. Those elements may be realized in different embodiments and may be obtained by different manufacturing processes. Embodiments of the invention do not rely on the strict realization of a certain embodiment. The interconnects between the n-contact layer 13, the p-contact layer 15 and further functional elements may be realized as a structured metallization layer made of a conductive material as a bond wire. The interconnects may couple to functional elements described herein directly or may comprise further functional elements. The description is thus to be regarded as illustrative instead of limiting.

The invention claimed is:

1. A photodiode being monolithically integrated onto a waveguide, the photodiode comprising a substrate having a first side and an opposing second side, the waveguide consisting essentially of a layer from a semi-insulating material having a first side and an opposing second side, the first side being arranged in direct contact with a semi-insulating surface, wherein the layer constituting the waveguide has a first refractive index, an electroconductive n-contact layer having a first side and an opposing second side, wherein the first side of the electroconductive n-contact layer is located on the second side of the waveguide, the n-contact layer having a second refractive index, an absorption layer having a first side and an opposing second side, wherein the first side of the absorption layer is arranged on the second side of the electroconductive n-contact layer, at least one p-contact layer having a first side and an opposing second side, wherein the first side of the p-contact layer is arranged on the second side of the absorption layer, wherein the second refractive index of the n-contact layer is larger than the first refractive index of the semi-insulating waveguide layer, and wherein the n-contact layer is elongated in the direction of the waveguide by a length L compared to the absorption layer and the p-contact layer.

2. The photodiode of claim 1, wherein the length L corresponds substantially to the beat length of the two light-guiding vertical lowest-order modes in a multimode waveguide area minus the absorption length.

3. The photodiode of claim 1, wherein the absorption layer comprises a thickness of approximately 350 nm.

4. The photodiode of claim 3, wherein the absorption layer comprises a width of approximately 5 µm.

5. The photodiode of claim 1, wherein the absorption layer comprises a length of approximately 7 µm.

6. The photodiode of claim 1, wherein the waveguide is configured as a waveguide rib.

7. The photodiode of claim 6, wherein the waveguide comprises a width of approximately 2 µm.

8. The photodiode of claim 1, wherein the n-contact layer comprises a thickness of approximately 300 nm.

9. The photodiode of claim 1, wherein the n-contact layer comprises a length of approximately 14 µm.

10. The photodiode of claim 1, comprising a quantum efficiency bandwidth product of 46 GHz with a responsivity of 0.5 A/W.

11. The photodiode of claim 1, wherein the substrate consists essentially of a semi-insulating InP substrate.

12. The photodiode of claim 1, wherein the p-contact consists essentially of any of InGaAs or InGaAsP.

13. A photodiode being monolithically integrated with a waveguide on a semi-insulating substrate comprising InP, the substrate having a first side and an opposing second side, the photodiode comprising a waveguide consisting essentially of a layer from a semi-insulating material having a first side and an opposing second side, the first side being arranged directly on the first side of the substrate, wherein the layer constituting the waveguide has a first refractive index, an electroconductive n-contact layer having a first side and an opposing second side, wherein the first side of the electroconductive n-contact layer is located on the second side of the layer constituting the waveguide, the n-contact layer having a second refractive index, an absorption layer having a first side and an opposing second side, wherein the first side of the absorption layer is arranged on the second side of the electroconductive n-contact layer, at least one p-contact layer having a first side and an opposing second side, wherein the first side of the p-contact layer is arranged on the second side of the absorption layer, wherein the second refractive index of the n-contact layer is larger than the first refractive index of the semi-insulating waveguide layer, wherein the n-contact layer is elongated in the direction of the waveguide by a length L compared to the absorption layer and the p-contact layer and wherein the length L corresponds substantially to the beat length of the two light-guiding vertical lowest-order modes in a multimode waveguide area minus the absorption length.

14. The photodiode of claim 13, comprising a quantum efficiency bandwidth product of 46 GHz with a responsivity of 0.5 A/W.

15. The photodiode of claim 13, wherein the absorption layer comprises a width of approximately 5 μm and a length of approximately 7 μm.

16. The photodiode of claim 15, wherein the n-contact layer comprises a length of approximately 14 μm.

17. The photodiode of claim 13, wherein the waveguide is configured as a rib waveguide.

18. A photodetector comprising a plurality of photodiodes being monolithically integrated on a substrate having a first side and an opposing second side, any of the photodiodes comprising a waveguide consisting essentially of a layer from a semi-insulating material having a first side and an opposing second side, the first side being arranged in direct contact with a semi-insulating surface, wherein the layer constituting the waveguide has a first refractive index, an electroconductive n-contact layer having a first side and an opposing second side, wherein the first side of the electroconductive n-contact layer is located on the second side of the layer constituting the waveguide, the n-contact layer having a second refractive index, an absorption layer having a first side and an opposing second side, wherein the first side of the absorption layer is arranged on the second side of the electroconductive n-contact layer, at least one p-contact layer having a first side and an opposing second side, wherein the first side of the p-contact layer is arranged on the second side of the absorption layer, wherein the second refractive index of the n-contact layer is larger than the first refractive index of the semi-insulating waveguide layer, and wherein the n-contact layer is elongated in the direction of the waveguide by a length L compared to the absorption layer and the p-contact layer.

19. The photodetector of claim 18, comprising any of a differential twin photodetector and/or a balanced photodetector and/or a travelling wave photodetector.

20. The photodetector of claim 18, wherein the length L corresponds substantially to the beat length of the two light-guiding vertical lowest-order modes in a multimode waveguide area minus the absorption length.

21. The photodetector of claim 18, wherein the absorption layer comprises a length of approximately 14 μm and the n-contact layer comprises a length of approximately 7 μm.

22. The photodetector of claim 18, wherein the waveguide is configured as a rib waveguide.

23. The photodetector of claim 18, wherein the n-contact layer comprises a thickness of approximately 300 nm.

24. The photodetector of claim 18, wherein the substrate consists essentially of a semi-insulating InP substrate.

\* \* \* \* \*

UNITED STATES PATENT AND TRADEMARK OFFICE
CERTIFICATE OF CORRECTION

PATENT NO. : 7,868,406 B2
APPLICATION NO. : 12/052891
DATED : January 11, 2011
INVENTOR(S) : Heinz-Gunter Bach et al.

It is certified that error appears in the above-identified patent and that said Letters Patent is hereby corrected as shown below:

On the Face Page

Item (73) Assignee:

Please delete "Forderung" after zur and insert --Förderung--.

Signed and Sealed this
Twenty-second Day of March, 2011

David J. Kappos
*Director of the United States Patent and Trademark Office*